(12) United States Patent
Kwon

(10) Patent No.: US 9,961,801 B2
(45) Date of Patent: May 1, 2018

(54) FAN ASSEMBLY AND ELECTRIC POWER EQUIPMENT HAVING THE SAME

(71) Applicant: LSIS CO., LTD., Anyang-si, Gyeonggi-do (KR)

(72) Inventor: Hyukil Kwon, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days. days.

(21) Appl. No.: 15/390,382

(22) Filed: Dec. 23, 2016

(65) Prior Publication Data
US 2017/0188484 A1 Jun. 29, 2017

(30) Foreign Application Priority Data
Dec. 28, 2015 (KR) .................. 10-2015-0187199

(51) Int. Cl.
*H05K 7/20* (2006.01)
*F04D 19/00* (2006.01)
(Continued)

(52) U.S. Cl.
CPC ....... *H05K 7/20736* (2013.01); *F04D 19/002* (2013.01); *F04D 25/166* (2013.01); *F04D 29/601* (2013.01); *G06F 1/20* (2013.01); *H05K 7/1439* (2013.01); *H05K 7/1487* (2013.01); *H05K 7/20009* (2013.01); *H05K 7/2019* (2013.01); *H05K 7/20136* (2013.01); *H05K 7/20172* (2013.01); *H05K 7/20181* (2013.01); *H05K 7/20581* (2013.01);
(Continued)

(58) Field of Classification Search
None
See application file for complete search history.

(56) References Cited

U.S. PATENT DOCUMENTS

2007/0035924 A1* 2/2007 Westphall ............... G06F 1/183
361/679.48
2011/0021132 A1 1/2011 Chou et al.
2012/0048815 A1 3/2012 Ye

FOREIGN PATENT DOCUMENTS

JP 03270198 A * 12/1991
JP H03270198 12/1991
(Continued)

OTHER PUBLICATIONS

Korean Intellectual Property Office Application No. 10-2015-0187199, Office Action dated Apr. 20, 2017, 52 pages.
(Continued)

*Primary Examiner* — Dimary Lopez Cruz
*Assistant Examiner* — Zhengfu Feng
(74) *Attorney, Agent, or Firm* — K&L Gates LLP

(57) ABSTRACT

A fan assembly includes a first guide, a second guide disposed in a direction vertical to the first guide such that the height of the first guide is adjustable, a slider disposed to move in a horizontal direction along the second guide, and a plurality of fan modules fastened to the slider, wherein each of the plurality of fan modules is fastened to the slider such that the height of the fan module is adjustable. Accordingly, the heights of the plurality of fan modules can be simultaneously adjusted, and the heights of some of the plurality of fan modules can be adjusted different from those of the other fan modules, so that the plurality of fan modules can be optimally installed.

17 Claims, 10 Drawing Sheets

(51) Int. Cl.
    *H05K 7/14*           (2006.01)
    *G06F 1/20*           (2006.01)
    *F04D 25/16*          (2006.01)
    *F04D 29/60*          (2006.01)

(52) U.S. Cl.
    CPC ..... *H05K 7/20727* (2013.01); *H05K 7/20745* (2013.01); *H05K 7/20909* (2013.01)

(56) References Cited

FOREIGN PATENT DOCUMENTS

| | | | |
|---|---|---|---|
| JP | 2005109341 | | 4/2005 |
| JP | 2009027051 | | 2/2009 |
| JP | 2009027051 A | * | 2/2009 |
| JP | 2010098858 | | 4/2010 |
| JP | 2012235067 | | 11/2012 |
| JP | 2012235067 A | * | 11/2012 |
| JP | 2014078582 | | 5/2014 |

OTHER PUBLICATIONS

Japanese Notice of Allowance for related Japanese Application No. 2016-249550; action dated Oct. 10, 2017; (1 pages).

* cited by examiner (a)

(b)

(c)

FAN ASSEMBLY AND ELECTRIC POWER EQUIPMENT HAVING THE SAME

CROSS-REFERENCE TO RELATED APPLICATIONS

Pursuant to 35 U.S.C. § 119(a), this application claims the benefit of earlier filing date and right of priority to Korean Patent Application No. 10-2015-0187199, filed on Dec. 28, 2015, the contents of which are all hereby incorporated by reference herein in its entirety.

BACKGROUND OF THE DISCLOSURE

1. Field of the Disclosure

The present disclosure relates to a fan assembly and a solar power conversion system having the same, and more particularly, to a fan assembly having a plurality of fan modules and a solar power conversion system having the same.

2. Description of the Conventional Art

A fan is also referred to as an air blower or a ventilator, and is a device that sucks or blows air by rotating wings, propellers, etc.

The fan may be installed in an electronic device such as an electric power electronic device or a household electric device. The fan may reduce the temperature of a part or module having a large amount of heat generated therefrom in an air cooling manner by allowing air to flow into the part or module.

The fan may be configured as a fan assembly that is an assembly of a plurality of members. The fan assembly may include a blower that allows air to flow when the fan assembly rotates, a motor that rotates the blower, and a flow path guide such as a fan housing, which forms a flow path of air.

The fan assembly may be provided with one blower. The fan assembly may be configured with a plurality of blowers. The fan assembly may simultaneously rotate a plurality of blowers by arranging the plurality of blowers in a parallel direction, when necessary.

In the fan assembly, the heat dissipation performance of an object to be heat-dissipated may be changed depending on the size of the blower, the number of rotations of the blower, the performance of the motor, the shape of the fan housing, the distance from the object to be heat-dissipated, and the like. The fan assembly is preferably configured to most efficiently dissipate heat of the object to be heat-dissipated.

The fan assembly may be installed in an electric power equipment such as a solar power conversion system (solar PCS) or an energy saving system (ESS). In this case, the installation position or structure of the fan assembly may become an important factor capable of determining the performance of the electric power equipment.

PRIOR ART DOCUMENT

Patent Document

JP patent laid-open No. 2010-98858 A (Published on Apr. 30, 2010)

JP patent laid-open No. 2009-27051 A (Published on Feb. 5, 2009)

SUMMARY OF THE DISCLOSURE

Therefore, an aspect of the detailed description is to provide a fan assembly and a solar power conversion system having the same, in which a plurality of fan modules can be optimally arranged, and the maintenance and repair of the plurality of fan module can be easily performed.

To achieve these and other advantages and in accordance with the purpose of this specification, as embodied and broadly described herein, a fan assembly includes: a first guide; a second guide disposed in a direction vertical to the first guide such that the height of the first guide is adjustable; a slider disposed to move in a horizontal direction along the second guide; and a plurality of fan modules fastened to the slider, wherein each of the plurality of fan modules is fastened to the slider such that the height of the fan module is adjustable.

In one exemplary embodiment, each of the plurality of fan modules may include: a plurality of fans; and a fan mounter mounted such that the plurality of fans blow air. The fan mounter may include a variable fastening plate fastened to the slider such that the height of the variable fastening plate is adjustable.

In one exemplary embodiment, a slider fastening part may be formed at the slider. A plurality of fan module fastening parts spaced apart from one another in the top-bottom direction may be formed at the variable fastening plate. The slider and the variable fastening plate may be fastened by a fastening member disposed to pass through one of the plurality of fan module fastening parts and the slider fastening part.

In one exemplary embodiment, the fan mounter may further include: a plurality of air guides; and an air guide installation plate at which the plurality of air guides are installed, the air guide installation plate being connected to the variable fastening part.

In one exemplary embodiment, the fan assembly may further include a side air guide disposed next to a fan module having a high height among the plurality of fan modules.

In one exemplary embodiment, the fan assembly may further include an upper air guide disposed at an upper side between fan modules having the same height among the plurality of fan modules.

In one exemplary embodiment, the top end of the side air guide may be higher than the top end of the upper air guide.

In one exemplary embodiment, a side air guide fixing part to which the side air guide is fixed and an upper air guide fixing part to which the upper air guide is fixed may be formed together at the slider.

In one exemplary embodiment, the fan assembly may further include a slider handle disposed at the front of the slider.

In one exemplary embodiment, the slider may include: a front body to which each of the plurality of fan modules is fastened such that the height of the fan module is adjustable; a side body disposed at the rear of the front body; and a roller rotatably installed at the side body to roll along the second guide.

To achieve these and other advantages and in accordance with the purpose of this specification, as embodied and broadly described herein, an electric power equipment includes: a case having a space formed therein; a plurality of modules arranged in the space; and a fan assembly disposed in the space to be located over the plurality of modules, the fan assembly allowing air to flow into the plurality of modules, wherein the fan assembly includes: a first guide mounted in the case, the first guide being disposed long in a vertical direction; a second guide disposed in a direction vertical to the first guide, the second guide disposed long in a horizontal direction; a slider disposed to move in the horizontal direction along the second guide; and a plurality of fan modules fastened to the slider, wherein the plurality of fan modules correspond one by one to the plurality of modules, wherein each of the plurality of fan modules is fastened to the slider such that the height of the fan module is adjustable.

In one exemplary embodiment, each of the plurality of fan modules may include: a plurality of fans blowing air in an upper direction; and a fan mounter to which the plurality of fans are mounted. The fan mounter may include a variable fastening plate fastened to the slider such that the height of the variable fastening plate is adjustable.

In one exemplary embodiment, the fan mounter may further include: a plurality of air guides hollowed in the top-bottom direction; and an air guide installation plate at which the plurality of air guides are installed, the air guide installation plate being connected to the variable fastening plate.

In one exemplary embodiment, the variable fastening plate may be vertically disposed, and the air guide installation plate may be horizontally disposed.

In one exemplary embodiment, the slider may include: a front body to which the variable fastening plate is fastened such that the height of the variable fastening plate is adjustable; a side body disposed at the rear of the front body; and a roller rotatably installed at the side body to roll along the second guide.

In one exemplary embodiment, the electric power equipment may further include a side air guide disposed next to a fan module having a high height among the plurality of fan modules.

In one exemplary embodiment, the electric power equipment may further include an upper air guide disposed at an upper side between fan modules having the same height among the plurality of fan modules, the upper air guide having at least a portion spaced apart from the side air guide in the left-right direction.

In one exemplary embodiment, the side air guide and the upper air guide may be arranged in parallel to each other. An air guide surface of the side air guide and an air guide surface of the upper air guide may face each other.

In one exemplary embodiment, a side air guide fixing part to which the side air guide is fixed and an upper air guide fixing part to which the upper air guide is fixed may be formed together at the slider.

In one exemplary embodiment, the electric power equipment may further include a slider handle disposed to protrude in the front direction at the front of the slider.

According to the present disclosure, the heights of a plurality of fan modules can be adjusted together, and the heights of some of the plurality of fan modules can be adjusted differently from those of the other fan modules. Accordingly, the plurality of fan modules can be optimally installed, and heat of an object, which the plurality of fan modules are to dissipate, can be more efficiently dissipated.

Further, when a service for repairing or replacing at least one of the plurality of fan modules is performed, all of the plurality of fan modules can be slid in the front-rear direction by moving the slider in the front-rear direction. Accordingly, the service for the fan modules becomes convenient.

Further, as air blown by a fan module having a relatively low height is blocked by the side air guide, it is possible to minimize the amount of the air sucked into a fan module having a relatively low height. In addition, each of the plurality of fan modules can optimally blow air.

Further, the side air guide fixing part and the upper air guide fixing part are formed together at the slider, so that it is possible to achieve a simplified structure and to minimize the number of parts.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWING

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF EXEMPLARY EMBODIMENTS

Description will now be given in detail of the exemplary embodiments, with reference to the accompanying drawings. For the sake of brief description with reference to the drawings, the same or equivalent components will be provided with the same reference numbers, and description thereof will not be repeated.

Figure 1:
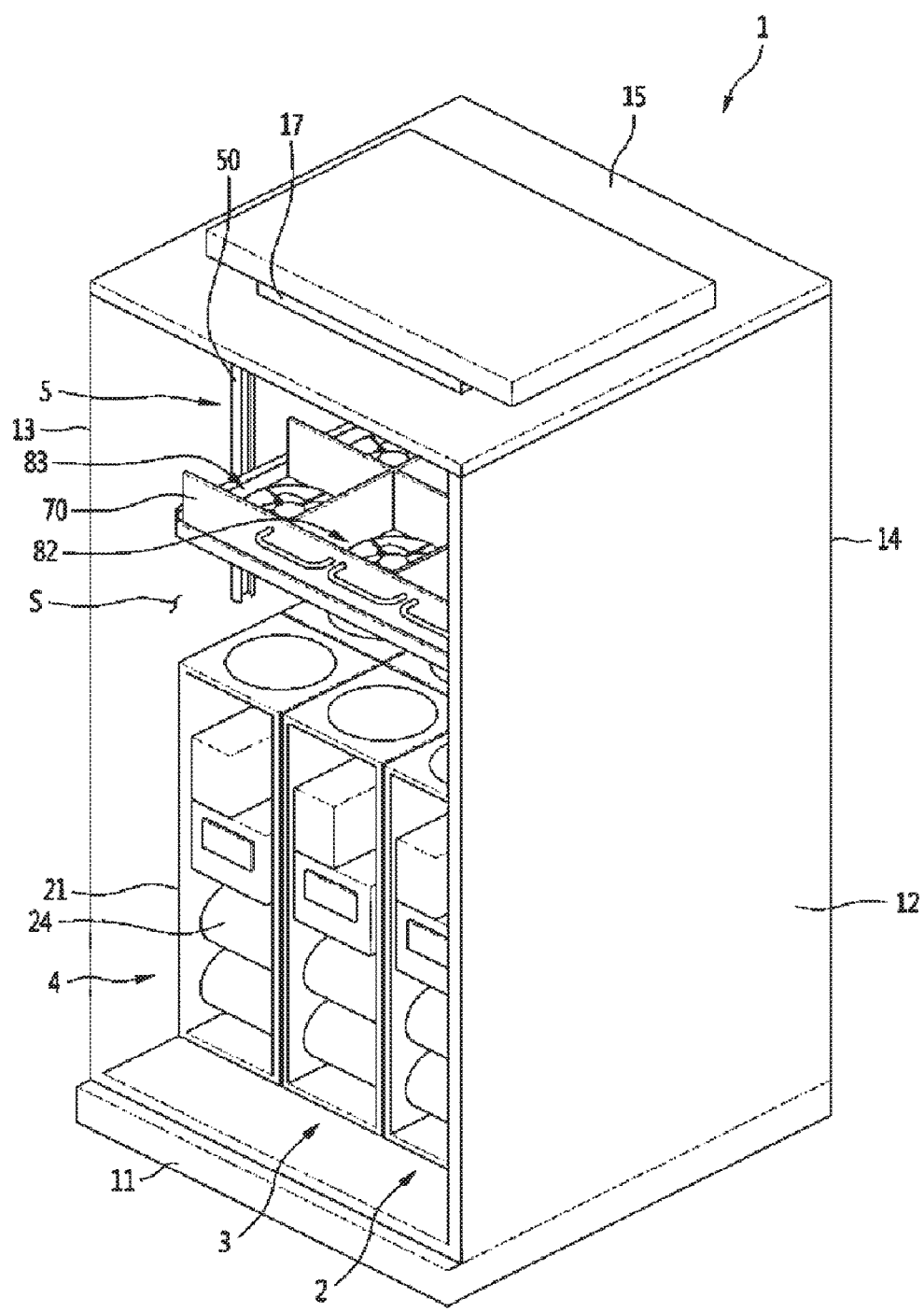
FIG. 1 is a perspective view showing an inside of a solar power conversion system to which a fan assembly is applied according to an exemplary embodiment.
Figure 2:
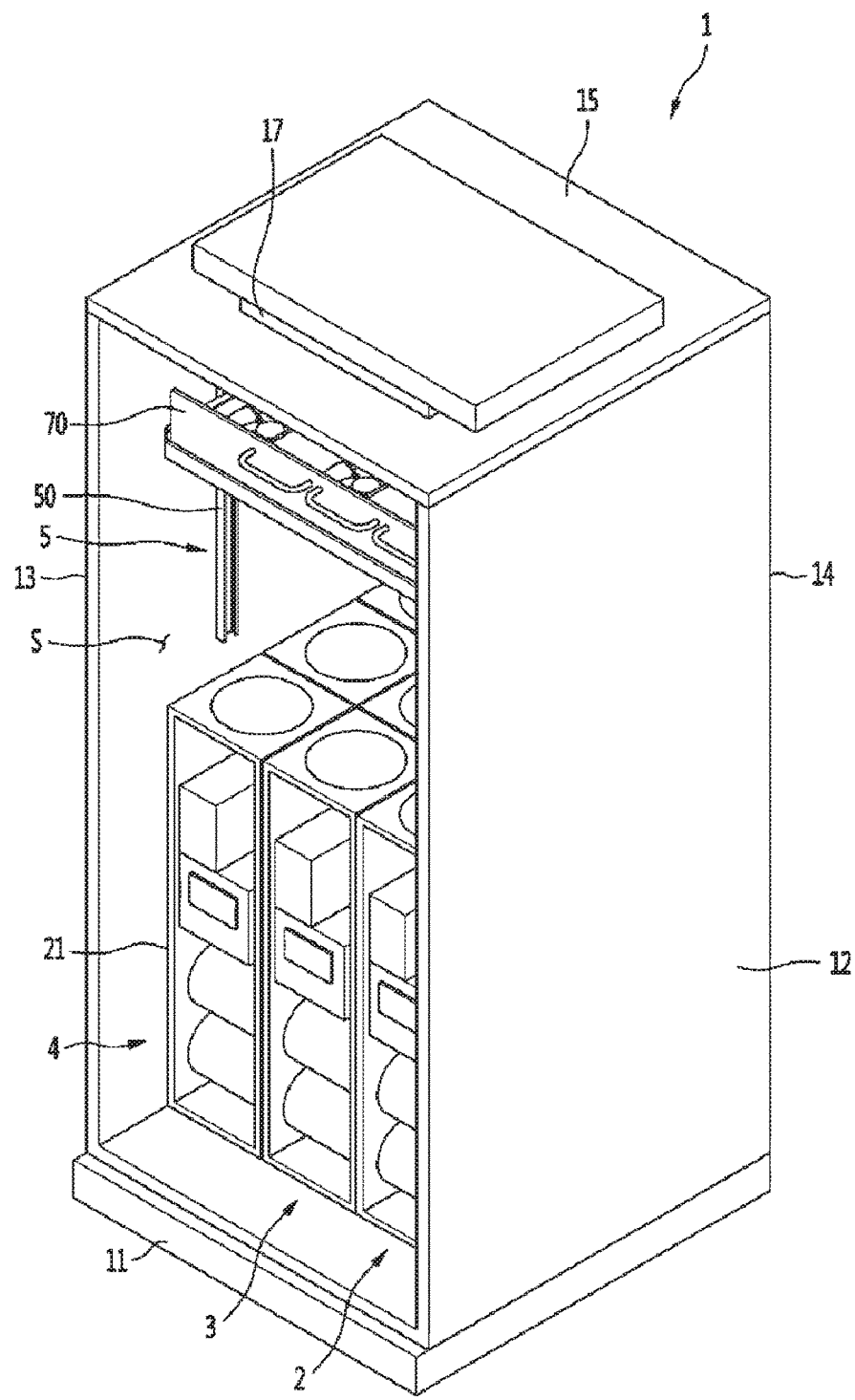
FIG. 2 is a perspective view when a fan module of the fan assembly shown in FIG. 1 is lifted.
Figure 3:
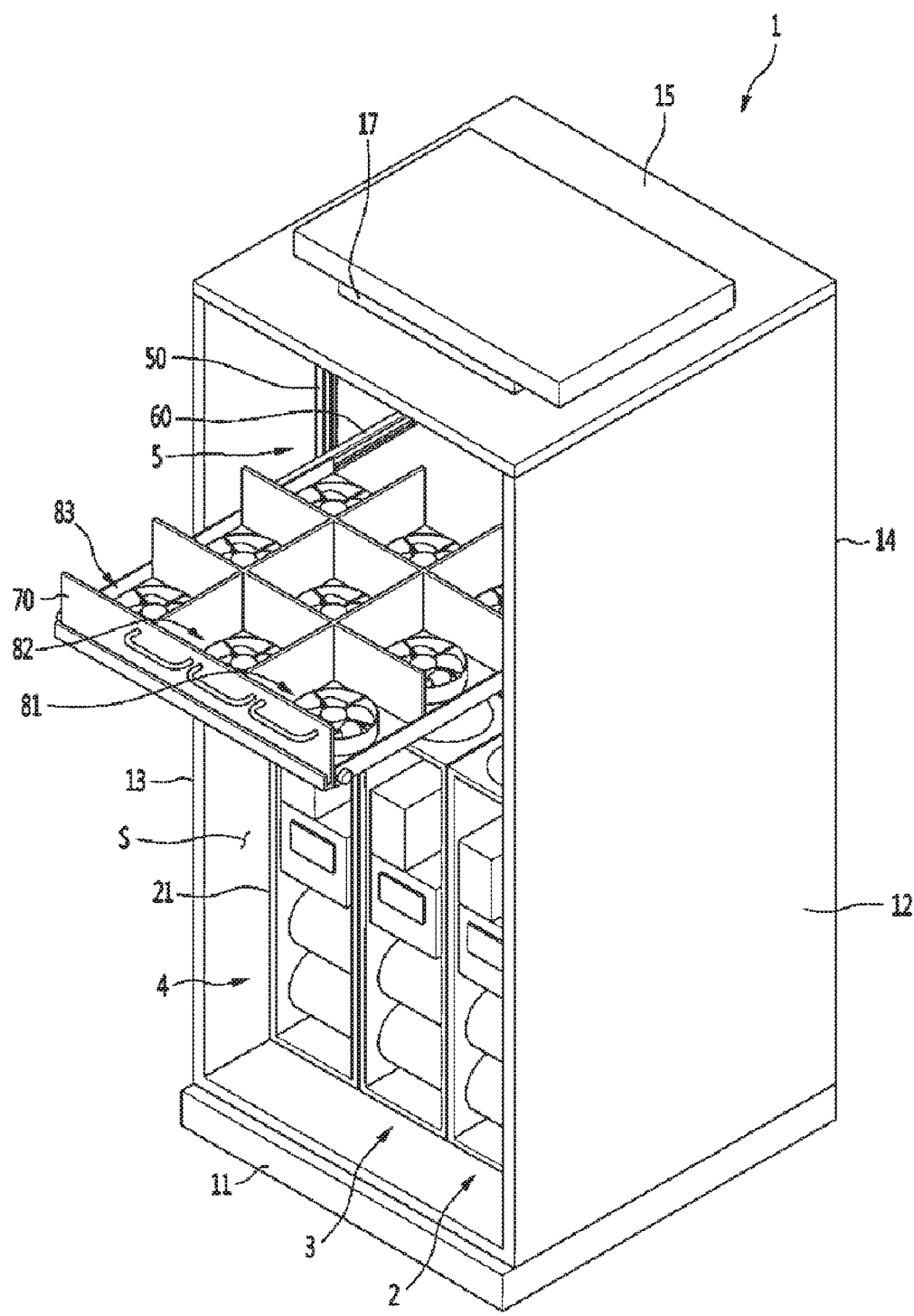
FIG. 3 is a perspective view when the fan module of the fan assembly shown in FIG. 1 is extracted in the front direction.
Figure 4:
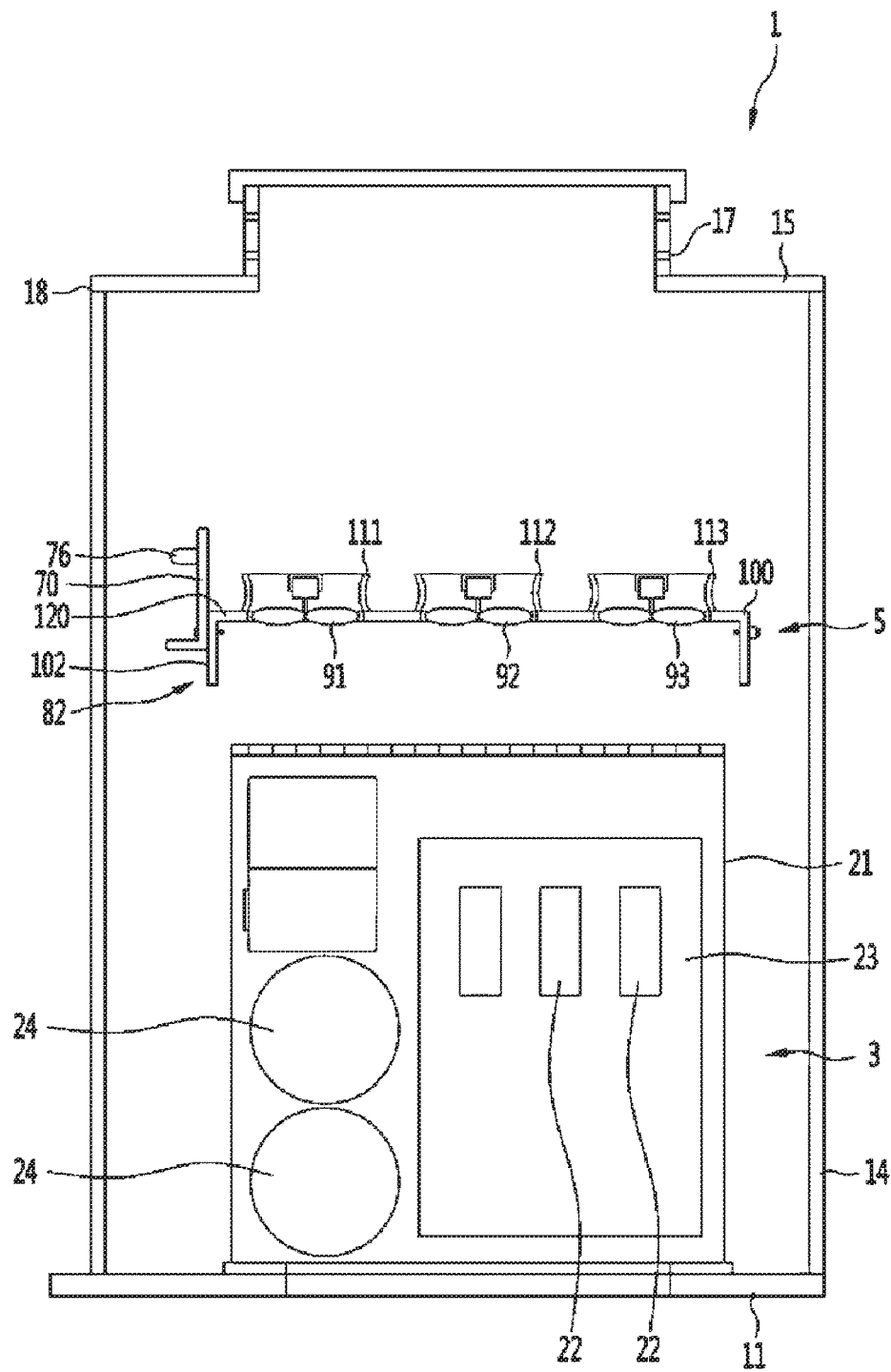
FIG. 4 is a sectional view showing the solar power conversion system to which the fan assembly is applied according to the exemplary embodiment.
Figure 5:
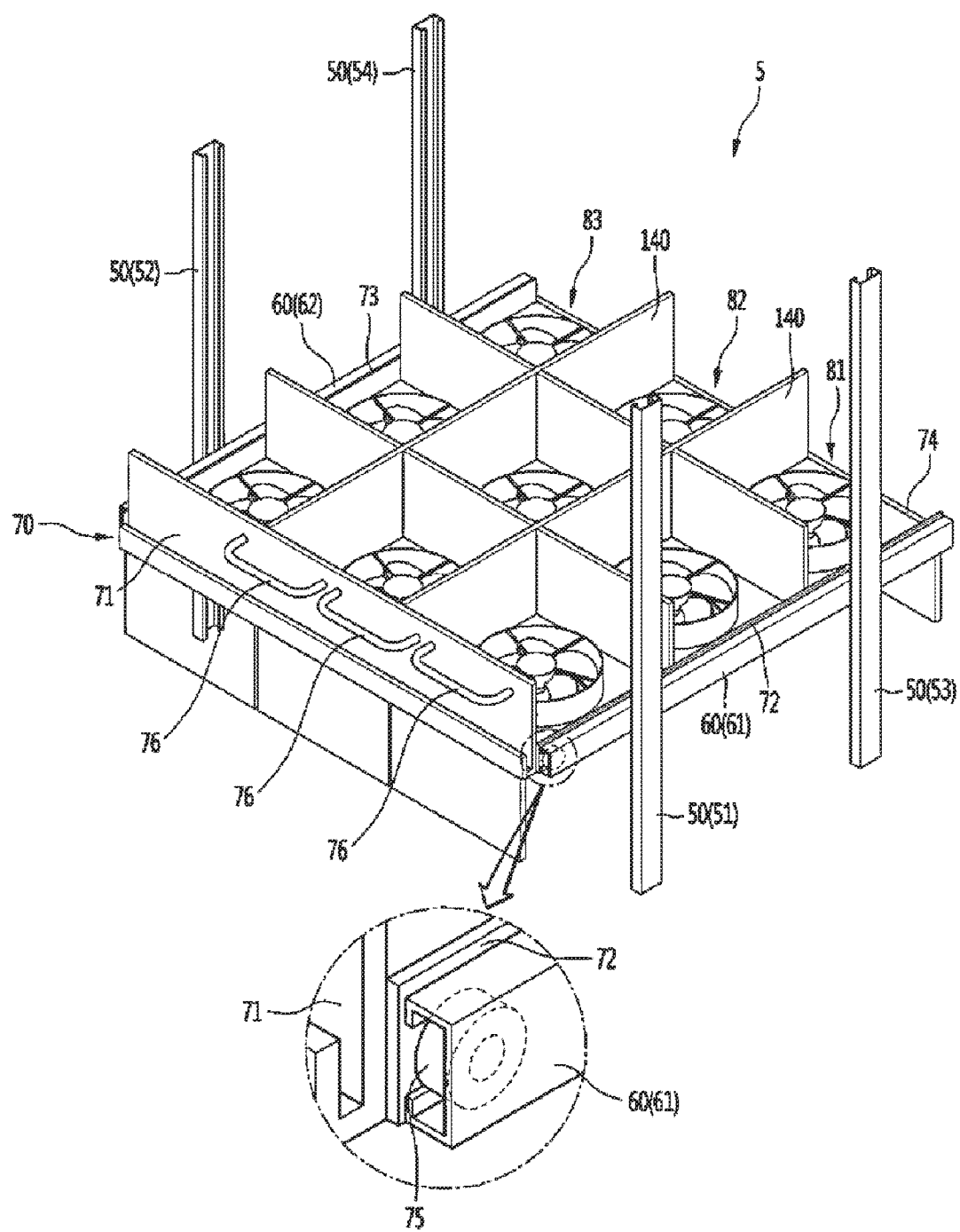
FIG. 5 is a perspective view when all of a plurality of fan modules of the fan assembly are installed at the same height according to the exemplary embodiment.
Figure 6:
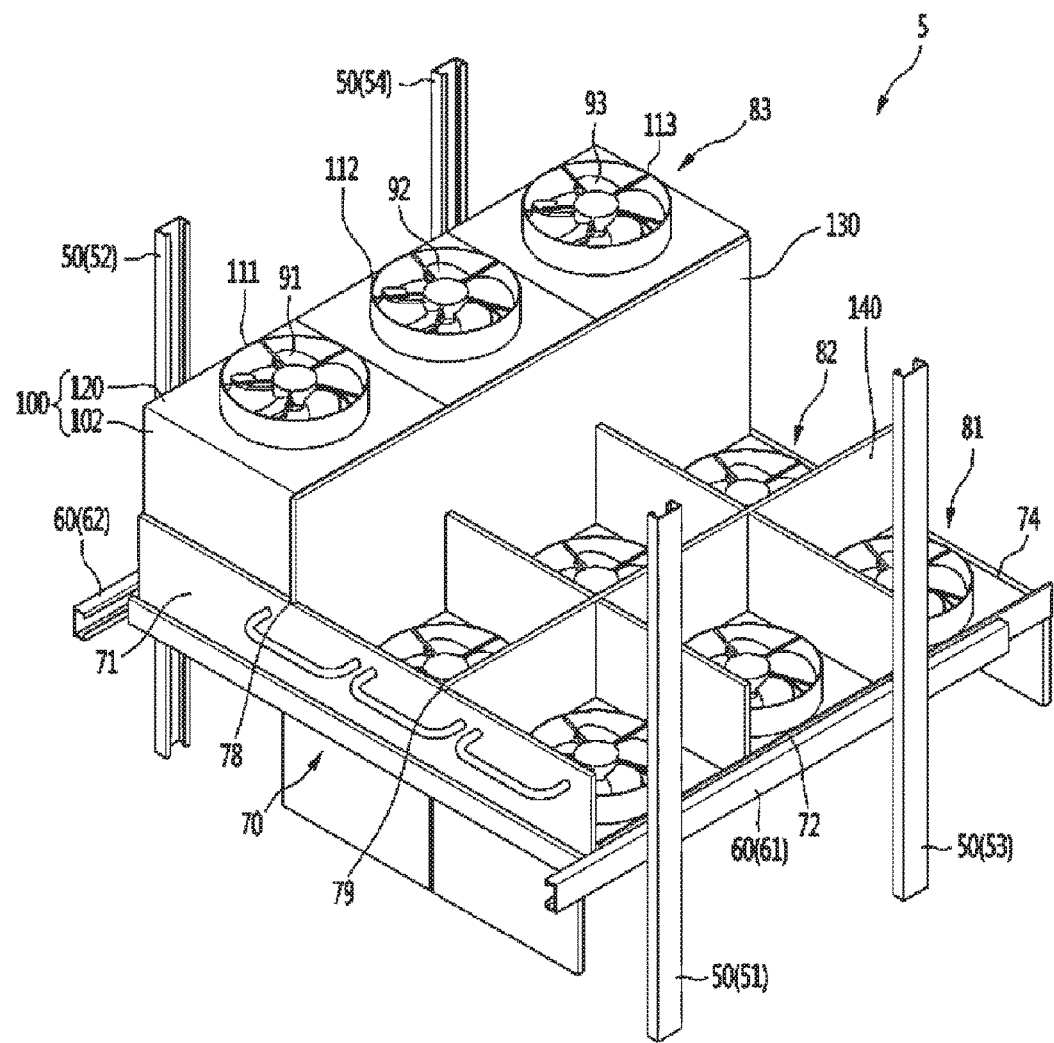
FIG. 6 is a perspective view when any one of the plurality of fan modules shown in FIG. 5 is installed higher than another fan module.
Figure 7:
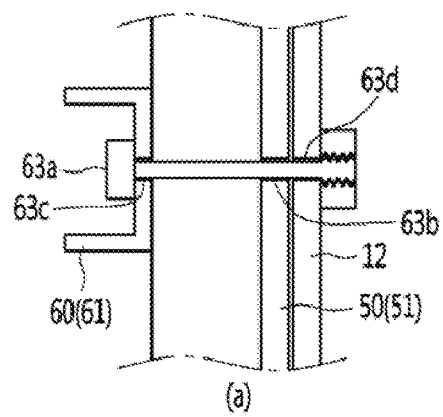
FIG. 7 is a sectional view showing an example in which a second guide of the fan assembly is mounted to a first guide according to the exemplary embodiment.
Figure 7:
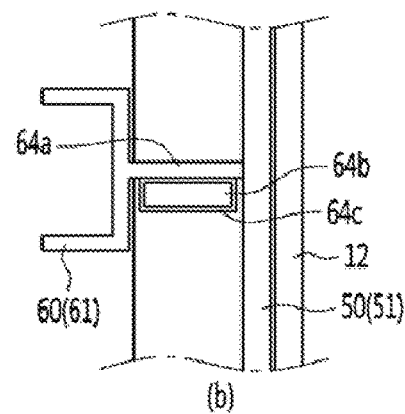
Figure 7:
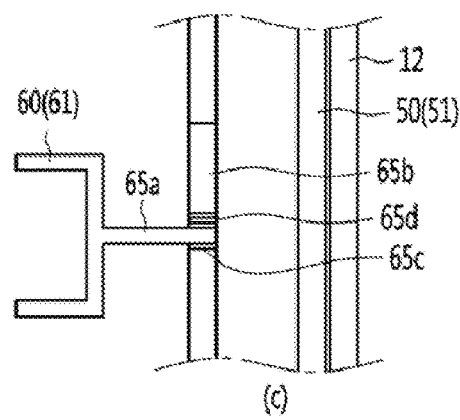
Figure 8:
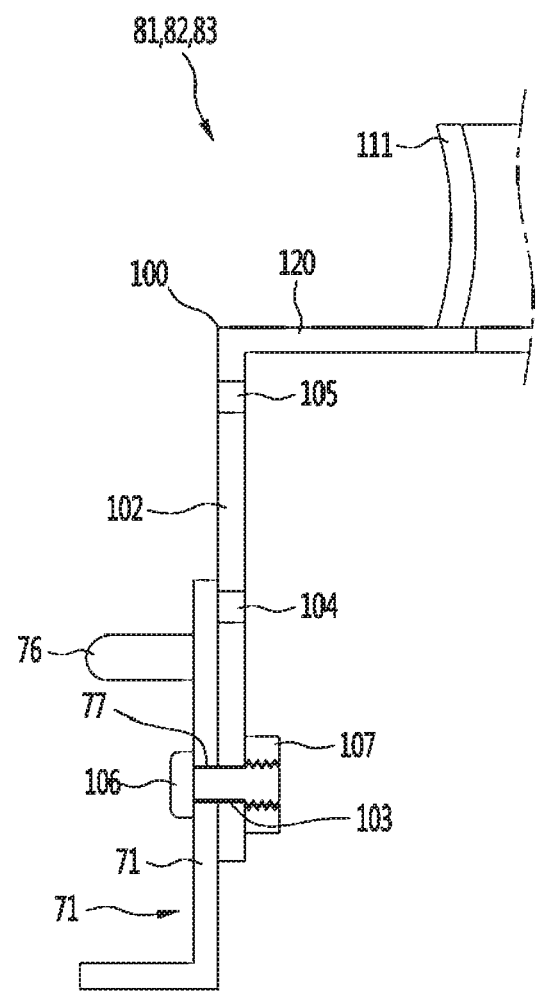
FIG. 8 is an enlarged sectional view when the fan module of the fan assembly is installed such that the position of the fan module is fixed to a slider according to the exemplary embodiment.

FIG. 1 is a perspective view showing an inside of a solar power conversion system to which a fan assembly is applied according to an exemplary embodiment. FIG. 2 is a perspective view when a fan module of the fan assembly shown in FIG. 1 is lifted. FIG. 3 is a perspective view when the fan module of the fan assembly shown in FIG. 1 is extracted in the front direction. FIG. 4 is a sectional view showing the solar power conversion system to which the fan assembly is applied according to the exemplary embodiment. FIG. 5 is a perspective view when all of a plurality of fan modules of the fan assembly are installed at the same height according to the exemplary embodiment. FIG. 6 is a perspective view when any one of the plurality of fan modules shown in FIG. 5 is installed higher than another fan module. FIG. 7 is a sectional view showing an example in which a second guide of the fan assembly is mounted to a first guide according to the exemplary embodiment. FIG. 8 is an enlarged sectional view when the fan module of the fan assembly is installed such that the position of the fan module is fixed to a slider according to the exemplary embodiment.

The solar power conversion system may include a case 1 having a space S formed therein, a plurality of modules 2, 3, and 4 arranged in the space S, and a fan assembly 5 disposed to be located over the plurality of modules 2, 3, and 4, the fan assembly 5 allowing air to flow into the plurality of modules 2, 3, and 4.

The case 1 may form an external appearance of the solar power conversion system. The case 1 may include a plurality of panels 11, 12, 13, 14, and 15. The plurality of panels 11, 12, 13, 14, and 15 may include a base panel 11, a pair of side panels 12 and 13, a rear panel 14, and a top panel 15.

The solar power conversion system may further include a door 18 that opens/closes the space S. The door 18 may be rotatably or slidably installed in the case 1 to open/close the space S.

In the solar power conversion system, an air inlet through which air is sucked into the case 1 may be formed in any one of the plurality of panels 11, 12, 13, 14, and 15. In the solar power conversion system, an air outlet 17 through which air is discharged to the outside of the case 1 may be formed in another of the plurality of panels 11, 12, 13, 14, and 15. The case 1 may form a flow path of air flowed by the fan assembly 5.

The air outlet 17 may be formed in the top panel 15. In this case, air blown from the fan assembly 5 may be discharged to an upper side of the solar power conversion system.

The air inlet may be formed in panels except the top panel 15. The air inlet may be formed in at least one of the base panel 11, the pair of side panels 12 and 13, the rear panel 14, and the door 18. The air inlet is preferably formed at a position at which, when the fan assembly 5 is driven, air can be most efficiently sucked into the plurality of modules 2, 3, and 4. The air inlet may be formed in the base panel 11. In this case, air sucked through the base panel 11 may be introduced into the plurality of modules to dissipate heat of the plurality of modules 2, 3, and 4 while passing through the plurality of modules 2, 3, and 4, and may be sucked into the fan assembly 5 located over the plurality of modules 2, 3, and 4. The air sucked into the fan assembly 5 may be blown in the upper direction of the fan assembly 5 while passing through the fan assembly 5 and then discharged to the air outlet 17.

The plurality of modules 2, 3, and 4 may be a plurality of heat dissipation modules in which heat generated in operation of the solar power conversion system is dissipated by the fan assembly 5. The plurality of modules 2, 3, and 4 may have the same function, and the function of a portion of the plurality of modules 2, 3, and 4 may be different from that of the others.

The plurality of modules 2, 3, and 4 may be arranged together under the fan assembly 5. The plurality of modules 2, 3, and 4 may be sequentially arranged in a direction perpendicular to the height adjustment direction of the fan assembly 5. The height adjustment direction of the fan assembly 5 may be the top-bottom direction, and the plurality of modules 2, 3, and 4 may be sequentially arranged in the direction perpendicular to the top-bottom direction. The plurality of modules 2, 3, and 4, as shown in FIGS. 1 to 3, may be sequentially arranged in the left-right direction under the fan assembly 5, or may be sequentially arranged in the front-rear direction. The plurality of modules 2, 3, and 4 are preferably sequentially arranged in the left-right direction to be exposed to the outside or loaded/unloaded through an open front side of the case 1. Thus, a worker can open the door 18 to perform a service on each of the plurality of modules 2, 3, and 4.

The plurality of modules 2, 3, and 4 may be configured as modules having the same configuration. Each of the plurality of modules 2, 3, and 4 may include a module case 21 forming an external appearance thereof.

The solar power conversion system may include a power electronic building block (PEBB). The solar power conversion system may include a power conversion unit that converts electric power generated in a solar cell. The power conversion unit may include a converter connected to the solar cell and an inverter linked with a system. The solar power conversion system may include a control unit that controls the power conversion unit. The control unit may include a detector that detects an output voltage or output current of the solar cell, and a controller that controls the power conversion unit on the basis of the detection of the detector. In the control unit, an insulated gate bipolar mode transistor (IGBT) 22 may be used as a detector that detects an output voltage of the solar cell. The solar power conversion system may include a heat sink 23 in which the IGBT 22 is installed. The heat sink 23 may absorb heat of the IGBT 22. The solar power conversion system may further include a capacitor 24 in which electric power generated in the solar cell is stored.

In the solar power conversion system, at least one of the IGBT 22, the heat sink 23, and the capacitor 24 may be installed in each of the modules 2, 3, and 4 to constitute each of the modules 2, 3, and 4. Each of the plurality of modules 2, 3, and 4 may include the IGBT 22, the heat sink 23, and the capacitor 24, and each of the IGBT 22, the heat sink 23, and the capacitor 24 may be installed to be located inside the module case 21 of each of the modules 2, 3, and 4.

The module case 21 may be formed in a structure through which air passes. In the module case 21, an inlet through which air is introduced into the module case 21 may be formed in at least one of front, rear, and bottom surfaces of the module case 21. An outlet through which air dissipating heat inside the module case 21 is discharged to the outside of the module case 21 may be formed in the module case 21. The outlet may be formed in a surface of the module case 21, which faces the fan assembly 5. The outlet may be formed in a top surface of the module case 21, and the air dissipating the heat inside the module case 21 may be sucked toward the fan assembly 5 by passing through the top surface of the module case 21.

The air sucked into the module case 21 may dissipate heat of the IGBT 22, the heat sink 23, and the capacitor 24, flow between the module case 21 and the fan assembly 5 through the outlet of the module case 21, and be then sucked into the fan assembly 5 between the module case 21 and the fan assembly 5.

The fan assembly 5 may be installed in the case 1 to be located over the plurality of modules 2, 3, and 4, and heat of the plurality of modules 2, 3, and 4 may be dissipated by one fan assembly 5. When the fan assembly 5 is driven, air may be distributed and introduced into the plurality of modules 2, 3, and 4 to dissipate the heat of the plurality of modules 2, 3, and 4, and air discharged from each of the plurality of modules 2, 3, and 4 may be discharged to the air outlet 17 through the fan assembly 5.

The fan assembly 5 may include a first guide 50, a second guide 60 disposed at the first guide 50 such that the height of the second guide 60 is adjustable in the vertical direction, a slider 70 disposed to move in the horizontal direction along the second guide 60, and a plurality of fan modules 81, 82, and 83 fastened to the slider 70.

The first guide 50 may be disposed vertically long in the case 1. The first guide 50 may include at least one vertical guide 51, 52, 53, and 54.

The first guide 50 may include at least one pair of left and right vertical guides spaced apart from each other in the left-right direction. The left and right vertical guides may be disposed at each of front and rear sides in the case 1. The first guide 50 may include four vertical guides.

The first guide 50 may be installed at the pair of side panels 12 and 13.

The first guide 50 may include a left front vertical guide 51 installed at a left panel 12 of the pair of side panels 12 and 13, and a right front vertical guide 52 installed at a right panel 13 of the pair of side panels 12 and 13. The right front vertical guide 52 may be installed to be spaced apart from the left front vertical guide 51 in the left-right direction.

The first guide 50 may further include a left rear vertical guide 53 installed at the left panel 12 to be located at the rear of the left front vertical guide 51, and a right rear vertical guide 54 installed at the right panel 13 to be located at the rear of the right front vertical guide 52.

The left front vertical guide 51, the right front vertical guide 52, the left rear vertical guide 53, and the right rear vertical guide 54 may have installation positions different from one another, all configurations except the installation positions may be identical to one another.

Hereinafter, when the plurality of vertical guides are distinguished from one another, the plurality of vertical guides are referred to as the left front vertical guide 51, the right front vertical guide 52, the left rear vertical guide 53, and the right rear vertical guide 54, and when the common configuration of the plurality of vertical guides is described, each of the plurality of vertical guides is referred to the first guide 50.

The first guide 50 may be a second guide supporter that allows the second guide 60 to be supported over the plurality of modules 2, 3, and 4. The first guide 50 may fix the second guide 60, the slider 70, and the plurality of fan modules 81, 82, and 83 to be spaced apart from the plurality of modules 2, 3, and 4.

The first guide 50 may include a fixing part that fixes the second guide 60. The fixing part may be provided in plurality in the first guide 50. The plurality of fixing parts may be formed at different heights of the first guide 50. The first guide 50 may be a second guide mounter to which the second guide 60 is mounted such that the height of the second guide 60 is adjustable.

The second guide 60 may be fixed to the first guide 50 such that the height of the second guide 60 is determined. The second guide 60 may be selectively fixed to one of the plurality of fixing parts, and the heights of the slider 70 and the plurality of fan modules 81, 82, and 83 may be determined based on the height of the fixing part to which the second guide 60 is fixed.

For example, when a total of three fixing parts are formed in the first guide 50, the three fixing parts may be located to be spaced apart from one another in the top-bottom direction. The three fixing part may include an upper fixing part, a middle fixing part, and a lower fixing part, which are spaced apart from one another in the top-bottom direction.

The second guide 60 may be fixed to the upper fixing part located at the uppermost side and, the plurality of fan modules 81, 82, and 83 may be located at an upper height in the case 1. When the second guide 60 is fixed to the upper fixing part, the plurality of fan modules 81, 82, and 83 may be disposed higher than when the second guide 60 is fixed to the middle fixing part or the lower fixing part. In this case, the plurality of fan modules 81, 82, and 83 may be located most distant from the plurality of modules 2, 3, and 4 shown in FIGS. 1 to 4.

On the other hand, the second guide 60 may be fixed to the lower fixing part located at the lowermost side and, the plurality of fan modules 81, 82, and 83 may be located at a lower height in the case 1. When the second guide 60 is fixed to the lower fixing part, the plurality of fan modules 81, 82, and 83 may be located lower than when the second guide 60 is fixed to the upper fixing part or the middle fixing part. In this case, the plurality of fan modules 81, 82, and 83 may be located closest to the plurality of modules 2, 3, and 4 shown in FIGS. 1 to 4.

In addition, the second guide 60 may be fixed to the middle fixing part between the upper fixing part and the lower fixing part, and the plurality of fan modules 81, 82, and 83 may be located at a middle height in the case 1. When the second guide 60 is fixed to the middle fixing part, the plurality of fan modules 81, 82, and 83 may be located lower than when the second guide 60 is fixed to the upper fixing part, and may be located higher than when the second guide 60 is fixed to the lower fixing part.

For convenience of illustration, the case where the three fixing parts are provided has been described as an example. However, the number of fixing parts formed in the first guide 50 is not limited to 3, and may be two or four or more.

The second guide 60, as shown in FIG. 7, may be fixed to the first guide 50 in various ways.

As shown in (a) of FIG. 7, a fastening member 63*a* such as a pin or a bolt and nut (hereinafter, referred to as a fastening member) may be used as an example in which the second guide 60 is fixed to the first guide 50.

Through-holes 63*b* and 63*c* may be formed in the first guide 50 and the second guide 60, respectively, and the fastening member 63*a* may be disposed to pass through the through-hole 63*b* of the first guide 50 and the through-hole 63*c* of the second guide 60, so the second guide 60 can be fixed to the first guide 50 through the fastening member 63*a*. It will be apparent that the fastening member 63*a* may be disposed to pass through a through-hole 63*d* of the side panel 12 together with the through-hole 63*b* of the first guide 50 and the through-hole 63*c* of the second guide 60.

In this case, a plurality of through-holes 63b may be formed in the first guide 50 at different heights of the first guide 50. The plurality of through-holes 63b may be formed to be spaced apart from one another in the top-bottom direction. The plurality of through-holes 63b formed in the first guide 50 may constitute a plurality of fixing parts that allow the second guide 60 to be fixed to the first guide 50 such that the height of the second guide 60 is adjustable.

When the worker disposes the fastening member 63a to pass through a through-hole located relatively high among the plurality of through-holes 63b and the through-hole 63c of the second guide 60, the slider 70 and the plurality of fan modules 81, 82, and 83 may be disposed relatively distant from the modules 2, 3, and 4.

On the contrary, when the worker disposes the fastening member 63a to pass through a through-hole located relatively low among the plurality of through-holes 63b and the through-hole 63c of the second guide 60, the slider 70 and the plurality of fan modules 81, 82, and 83 may be disposed relatively close to the modules 2, 3, and 4.

The through-hole 63b formed in the first guide 50 may constitute a plurality of fixing parts that allow the second guide 60 to be fixed to the first guide 50 such that the height of the second guide 60 is adjustable.

As shown in (b) of FIG. 7, a support 64b that supports a portion 64a of the second guide 60 may be attachably/detachably installed at the first guide 50, as another example in which the second guide 60 is fixed to the first guide 50. The support 64b may be formed in the shape of a plate body on which the portion 64a of the second guide 60 can be put and mounted. In this case, a support insertion hole 64c into which the support 64b is inserted and supported may be formed in the first guide 50. A plurality of support insertion holes 64c may be formed at different heights of the first guide 50.

When the height of the second guide 60 is selected by the worker, the worker may fix the support 64b to the first guide 50 by inserting the support 64b into any one of the plurality of support insertion holes 64c, and the portion 64a of the second guide 60 may be mounted on the support 64b. In this case, the position of the second guide 60 may be determined in the state in which the portion 64a of the second guide 60 is mounted on the support 64b.

The plurality of support insertion holes 64c formed in the first guide 50 may constitute a plurality of fixing parts that allow the second guide 60 to be fixed to the first guide 50 such that the height of the second guide 60 is adjustable.

As shown in (c) of FIG. 7, a projection 65a formed at any one of the first guide 50 and the second guide 60 may be mounted in a projection mounting groove 65b formed in the other of the first guide 50 and the second guide 60, as still another example in which the second guide 60 is fixed to the first guide 50. When the projection 65a is mounted in the projection mounting groove 65b, the second guide 60 may be fixed to the first guide 50. When the projection 65a is formed at the first guide 50, a plurality of projections 65a may be formed at different heights of the first guide 50. On the contrary, when the projection mounting groove 65b is formed in the first guide 50, a plurality of projection mounting grooves 65b may be formed at different heights of the first guide 50.

The projection mounting groove 65b may be formed in various shapes. As an example of the projection 65a and the projection mounting groove 65b, when the projection 65a is formed to protrude at the second guide 60, and the projection mounting groove 65b having a '┐' sectional shape is formed is formed in the first guide 50, the projection 65a may be guided in the front-rear direction along a horizontal portion of the projection mounting groove 65b, be guided in the top-bottom direction along a vertical portion of the projection mounting groove 65b, and be mounted on a bottom end 65c of the vertical portion of the projection mounting groove 65b. When the projection 65a is mounted on the bottom end 65c of the vertical portion of the projection mounting groove 65b, the height of the second guide 60 may be determined. In this case, a holding projection 65d may be formed at a position higher than the bottom end 65c of the projection mounting groove 65b in the projection mounting groove 65b. When the projection 65a enters/exits, the projection 65a can climb over the holding projection 65d. When the projection 65a is mounted on the bottom end 65c of the projection mounting groove 65b, the holding projection 65d can prevent the projection 65a from being shaken or arbitrarily separated.

The plurality of projections 65a or the plurality of projection mounting grooves 65b may constitute a plurality of fixing parts that fix the second guide 60 to the first guide 50 such that the height of the second guide 60 is adjustable.

The second guide 60 may be fixed to the first guide 50 in the various ways described above such that the height of the second guide 60 is adjustable. It will be apparent that the present disclosure is not limited to the above-described examples in which the second guide 60 is fixed to the first guide 50.

The second guide 60 may guide the slider 70 to slide forward/backward in a state in which the second guide 60 is supported by the first guide 50 such that the position of the second guide 60 is fixed.

The second guide 60 may include a pair of horizontal guides 61 and 62. The pair of horizontal guides 61 and 62 may include a left horizontal guide 61 and a right horizontal guide 62. The left horizontal guide 61 and the right horizontal guide 62 may be fixed to the first guide 50 such that the heights of the left horizontal guide 61 and the right horizontal guide 62 are equal to each other. The left horizontal guide 61 and the right horizontal guide 62 may be spaced apart from each other in the left-right direction.

The left horizontal guide 61 and the right horizontal guide 62 may have the same configuration except their positions. Hereinafter, when the pair of horizontal guides 61 and 62 are distinguished from each other, the pair of horizontal guides 61 and 62 are referred to as the left horizontal guide 61 and the right horizontal guide 62, and when the common configuration of the pair of horizontal guides 61 and 62 is described, each of the pair of horizontal guides 61 and 62 is referred to the second guide 60.

The second guide 60 may be formed in a '⊏' sectional shape. The left horizontal guide 61 and the second horizontal guide 62 may have a shape in which their surfaces opposite to each other are open.

The left horizontal guide 61 may have an open right surface. The left horizontal guide 61 may include a left plate, a top plate bent at the top end of the left plate, and a bottom plate bent at the bottom end of the left plate.

The right horizontal guide 62 may have an open left surface. The right horizontal guide 62 may include a right plate, a top plate bent at the top end of the right plate, and a bottom plate bent at the bottom end of the right plate.

The second guide 60 may guide the slider 70 to move in the front-rear direction in a state in which the second guide 60 is disposed long in the front-rear direction in the space S of the case 1.

The slider 70 may include a front body 71 and side bodies 72 and 73 disposed at the rear of the front body 71. The slider 70 may further include a rear body 74 connected to rear portions of the side bodies 72 and 73.

When the slider 70 includes all of the front body 71, the side bodies 72 and 73, and the rear body 74, a space in which the plurality of fan modules 81, 82, and 83 are accommodated together may be formed inside the slider 70.

The width of front body 71 in the top-bottom direction may be longer than the width of fans 91, 92, and 93, which will be described later, in the top-bottom direction. Thus, the front body 71 can prevent air blown upward from the fans 91, 92, and 93 from flowing back to the plurality of modules 2, 3, and 4 shown in FIGS. 1 to 4 over the front body 71. That is, the front body 71 can serve as an air guide that guides the air blown upward from the fans 91, 92, and 93 in the upper direction.

The side bodies 72 and 73 may include a left side body 72 and a right side body 73 spaced apart from the left side body 72.

The front end of the left side body 72 may be connected to the front body 71, and the rear end of the left side body 72 may be connected to the rear body 74.

The front end of the right side body 73 may be connected to the front body 71, and the rear end of the right side body 73 may be connected to the rear body 74.

The slider 70 may further include a roller 75 rotatably installed at the side bodies 72 and 73 to roll along the second guide 60. The roller 75 may be rotatably installed at the left side body 72, and may be rotatably installed at the right side body 73. A plurality of rollers 75 may be respectively installed at the left side body 72 and the right side body 73 to be spaced apart from each other in the front-rear direction.

The fan assembly 5 may further include a slider handle 76 disposed at the rear of the slider 70. In the fan assembly 5, as shown in FIG. 3, the entire or a portion of the slider 70 may be pulled to the front of the space S of the case 1 so as to perform a service for the plurality of fan modules 81, 82, and 83, and the like. When the slider 70 is pulled to the front of the space S of the case 1, at least a portion of each of the plurality of fan modules 81, 82, and 83 may be extracted to the outside of the case 1, and the worker may perform a service for the plurality of fan modules 81, 82, and 83 at the upper or lower side of the plurality of fan modules 81, 82, and 83 extracted to the outside of the case 1. Thus, it is unnecessary that the work should extract the plurality of modules 2, 3, and 4 so as to perform a service for the plurality of fans 81, 82, and 83. Further, the worker can more easily perform the service for the plurality of fan modules 81, 82, and 83.

If the service is completed, the worker may push the slider 70 into the space S of the case 1, and the plurality of fan modules 81, 82, and 83 may be inserted into the space S of the case 1 to be located over the plurality of modules 2, 3, and 4.

The slider handle 76 may be a handle grasped by the worker when the worker pulls/pushes the slider 70. The slider handle 76 may be provided at the front body 71 of the slider 70.

The slider handle 76 may be provided at the front body 71 of the slider 70 to protrude in the front direction. The slider handle 76 may be configured as a protruding handle having a rear end connected to the front body 71 and a front end located at the front of the front body 71 of the slider 70.

It will be apparent that the slider handle 76 may be configured as a groove part formed in a shape recessed in the slider 70. Also, it will be apparent that the shape of the slider handle 76 is not limited as long as it is configured such that the worker can grasp it.

Each of the plurality of fan modules 81, 82, and 83 may be fastened to the slider 70 such that the height of each of the plurality of fan modules 81, 82, and 83 is adjustable. The plurality of fan modules 81, 82, and 83 may be configured to have the same structure, and the positions of the plurality of modules 81, 82, and 83 may be different from one another.

When the number of the plurality of fan modules 81, 82, and 83 is three, the plurality of fan modules 81, 82, and 83 may include a first fan module 81 located at the leftmost side, a second fan module 82 located at the right side of first fan module 81, and a third fan module 83 located at the right side of the second fan module 82. The first fan module 81, the second fan module 82, and the third fan module 83 have only positions different from one another, and may be configured to have the same structure.

The plurality of fan modules 81, 82, and 83 may be provided in a number corresponding to the plurality of modules 2, 3, and 4. That is, the fan modules 81, 82, and 83 may be provided for each of the modules 2, 3, and 4. The plurality of fan modules 81, 82, and 83 may correspond one by one to the plurality of modules 2, 3, and 4.

For example, when the number of the plurality of modules 2, 3, and 4 is three, the number of the plurality of fan modules 81, 82, and 83 may be three.

The plurality of modules 2, 3, and 4 may include a first module 2 located at the leftmost side, a second module 3 located at the right side of the first module 2, and a third module 4 located at the right side of the second module 3.

In this case, the first fan module 81 is located over the first module 2, and may be mounted to the slider 70 such that the installation height of the first fan module 81 is variable.

In addition, the second fan module 82 is located over the second module 3, and may be mounted to the slider 70 such that the installation height of the second fan module 82 is variable.

In addition, the third fan module 83 is located over the third module 4, and may be mounted to the slider 70 such that the installation height of the third fan module 83 is variable.

Each of the plurality of fan modules 81, 82, and 83 may include a plurality of fans 91, 92, and 93, and a fan mounter 100 mounted such that the plurality of fans 91, 92, and 93 blow air in directions parallel to one another.

Here, each of the plurality of fans 91, 92, and 93 may include a blower that blows air in its rotation and a motor that rotates the blower. The blower may be configured as a blower of an axial flow fan, and a rotating shaft of the motor, which rotates the blower, may be disposed long in the top-bottom direction. When the motor rotates, the blower may blow air in the top-bottom direction.

When the number of the plurality of fan modules 81, 82, and 83 is three, each of the first fan module 81, the second fan module 82, and the third fan module 83 may include the plurality of fan 91, 92, and 93 and the fan mounter 100, and the height of the plurality of fans 91, 92, and 93 (i.e., the distance from each of the first fan module 81, the second fan module 82, and the third fan module 83) may be determined based on the height at which the fan mounter 100 is mounted.

The plurality of fan modules 81, 82, and 83 may be sequentially located in the left-right direction in the case 1. In each of the plurality of fan modules 81, 82, and 83, the plurality of fans 91, 92, and 93 may be sequentially located in the front-rear direction.

When three fan modules 81, 82, and 83 are included in one fan assembly 5, and each of the fan modules 81, 82, and 83 includes three fans 91, 92, and 93, the fan assembly 5 may include a total of nine fans 91, 92, and 93. In the fan assembly 5, the plurality of fans may be arranged in three rows and three columns, and each of the nine fans may suck air thereinto and blow the air upward therefrom.

In the fan assembly 5, when the height of any one of the plurality of fan modules 81, 82, and 83 is changed to be higher than that of the other fan modules, the plurality of fans of the fan module having a relatively high height and the plurality of fans of the fan module having a relatively low height may differently dissipate heats of the modules located thereunder, respectively.

The fan mounter 100 may include a variable fastening plate 102 fastened to the slider 70 such that the height of the variable fastening plate 102 is adjustable. The variable 102 may be configured as a plate body having a predetermined height in the top-bottom direction. The variable fastening plate 102 may be fastened to the slider 70 to face at least a portion of the slider 70 in the front-rear direction. The variable fastening plate 102 may be fastened to the front body 71 of the slider 70 such that the height of the variable fastening plate 102 is adjustable.

The fan mounter 100 may further include a plurality of air guides 111, 112, and 113, and an air guide installation plate 120 at which the plurality of air guides 111, 112, and 113 are installed, the air guide installation plate 120 being connected to the variable fastening plate 102.

The plurality of air guides 111, 112, and 113 may be sequentially arranged at the air guide installation plate 120 in the front-rear direction. Each of the plurality of air guides 111, 112, and 113 may be formed in a shape hollowed in the top-bottom direction such that air at a lower side thereof is discharged to an upper side thereof.

The air guide installation plate 120 may be orthogonal to the variable fastening plate 102. The variable fastening plate 102 may be orthogonally bent downward at the front end or rear end of the air guide installation plate 120. The variable fastening plate formed at the front end of the air guide installation plate 120 may be fastened to the front body 71 of the slider 70 such that the height of the variable fastening plate is adjustable, and the variable fastening plate formed at the rear end of the air guide installation plate 120 may be fastened to the rear body 74 of the slider 70 such that the height of the variable fastening plate is adjustable.

The variable fastening plate 102 may fastened to the slider 70 to be vertically disposed, and the air guide installation plate 120 may be horizontally disposed as the variable fastening plate 102 is vertically disposed. One of the front and rear surfaces of the variable fastening plate 102 may face the slider 70 in the front-rear direction, and the other of the front and rear surfaces of the variable fastening plate 102 may be an air guide surface that guides air flowing into the plurality of fans.

The plurality of fans 91, 92, and 93 constituting one fan module may blow air at the same height in directions parallel to one another.

The fan assembly 5 may further include a side air guide 130 disposed next to a fan module having a high height among the plurality of fan modules 81, 82, and 83.

The side air guide 130 may be disposed to prevent air blown upward from a fan module having a relatively low height from being sucked into a fan module having a relatively high height through a lower side of the fan module. The air blown upward from the fan module having the relatively low height among the plurality of fan modules 81, 82, and 83 is blocked by the side air guide 130 not to flow in a side direction due to the side air guide 130, and may be blown upward while being guided by the side air guide 130.

Each of one side surface and the other side surface of the side air guide 130 may be an air guide surface that guides air. Any one of the one side surface and the other side surface may be a suction guide surface that guides air sucked into a fan module having a relatively high height, and the other of the one side surface and the other side surface may be a discharge guide surface that guides air blown by a fan module having a relatively low height.

The fan assembly 5 may further include an upper air guide 140 disposed at an upper side between fan modules having the same height among the plurality of fan modules 81, 82, and 83.

The upper air guide 140 may be disposed to guide air blown by the fan modules having the same height in an upper direction.

The top end of the side air guide 130 may be higher than the top end of the upper air guide 140.

Each of the side air guide 130 and the upper air guide 140 may be vertically disposed. The side air guide 130 and the upper air guide 140 may be disposed in parallel to each other. At least a portion of the upper air guide 140 may be spaced apart from the side air guide 130 in the left-right direction.

Each of the side air guide 130 and the upper air guide 140 may have an air guide surface that guides air. The air guide surface of the side air guide 130 and the air guide surface of the upper air guide 140 may face each other.

Each of the side air guide 130 and the upper air guide 140 may be disposed in a direction orthogonal to the front body 71 of the slider 70. The front end of the side air guide 130 may be fixed to the front body 71, and the rear end of the side air guide 130 may be fixed to the rear body 74.

The side air guide 130 and the upper air guide 140 may be fixed together with the slider 70. A side air guide fixing part 78 to which the side air guide 130 is fixed and an upper air guide fixing part 79 to which the upper air guide 140 is fixed may be formed together at the slider 70.

The side air guide fixing part 78 formed at the slider 70 may be configured as an insertion groove into which the front end of the side air guide 130 is inserted and fitted. The upper air guide fixing part 79 formed at the slider 70 may be configured as an insertion groove into which the front end of the upper air guide 140 is inserted and fitted.

A slider fastening part to which each of the plurality of fan modules 81, 82, and 83 is fastened may be formed at the slider 70. The slider fastening part may be provided for each of the fan modules 81, 82, and 83. The slider fastening part may be formed at at least one of the front body 71 and the rear body 74.

In addition, a fan module fastening part fastened to the slider 70 may be formed at each of the plurality of fan modules 81, 82, and 83.

Each of the slider fastening part and the fan module fastening part may be a through-hole through which a fastening member such as a bolt and nut disposed to pass. In addition, the fastening member may be disposed to pass through the slider fastening part and the fan module fastening part, thereby allowing the slider 70 and the fan modules 81, 82, and 83 to be fastened to each other.

At least one of the slider fastening part and the fan module fastening part may be provided in plurality per fan module.

In the fan assembly 5, a plurality of slider fastening parts may be provided per fan module, and a plurality of fan module fastening parts may be provided per fan module.

Hereinafter, a case where a plurality of slider fastening parts are provided to the slider 70 will be described as follows.

For example, when three fan modules 81, 82, and 83 are included in one fan assembly, and three slider fastening parts are formed per fan module, nine slider fastening parts may be formed at the slider 70.

A case where the plurality of fan modules 81, 82, and 83 includes a first fan module 81, a second fan module 82, and a third fan module 83 will be described as follows.

The slider 70 may include a first lower fastening part at which the first fan module 81 is fastened at a low height to the slider 70, a first upper fastening part at which the first fan module 81 is fastened at a high height to the slider 70, and a first center fastening part formed between the first lower fastening part and the first upper fastening part. In this case, the first fan module 81 may be fastened to any one of the first lower fastening part, the first upper fastening part, and the first center fastening part, using a fastening member such as a bolt and nut.

The slider 70 may include a second lower fastening part at which the second fan module 82 is fastened at a low height to the slider 70, a second upper fastening part at which the second fan module 82 is fastened at a high height to the slider 70, and a second center fastening part formed between the second lower fastening part and the second upper fastening part. In this case, the second fan module 82 may be fastened to any one of the second lower fastening part, the second upper fastening part, and the second center fastening part, using a fastening member such as a bolt and nut.

The slider 70 may include a third lower fastening part at which the third fan module 83 is fastened at a low height to the slider 70, a third upper fastening part at which the third fan module 83 is fastened at a high height to the slider 70, and a third center fastening part formed between the third lower fastening part and the third upper fastening part. In this case, the third fan module 83 may be fastened to any one of the third lower fastening part, the third upper fastening part, and the third center fastening part, using a fastening member such as a bolt and nut.

The first lower fastening part, the second lower fastening part, and the third lower fastening part may be formed at the same height of the slider 70. The first center fastening part, the second center fastening part, and the third center fastening part may be formed at the same height of the slider 70. The first upper fastening part, the second upper fastening part, and the third upper fastening part may be formed at the same height of the slider 70.

When the first fan module 81 is fastened to the first lower fastening part, the second fan module 82 is fastened to the second lower fastening part, and the third fan module 83 is fastened to the third lower fastening part, the first fan module 81, the second fan module 82, and the third fan module 83 may be installed to be located at the same height.

On the other hand, when the first fan module 81 is fastened to the first center fastening part, the second fan module 82 is fastened to the second lower fastening part, and the third fan module 83 is fastened to the third lower fastening part, the first fan module 81 may be installed higher than the second fan module 82 and the third fan module 83.

In addition, when the first fan module 81 is fastened to the first upper fastening part, the second fan module 82 is fastened to the second center fastening part, and the third fan module 83 is fastened to the third lower fastening part, the first fan module 81 may be installed relatively higher than the second fan module 82, and the second fan module 82 may be installed relatively higher than the third fan module 83. In this case, the first fan module 81, the second fan module 82, and the third fan module 83 may be installed at the slider 70 such that their installation heights are different from one another.

Meanwhile, the present disclosure is not limited to the above-described examples in which the fan modules 81, 82, and 83 are mounted, and the fan modules 81, 82, and 83 may be mounted in various combinations. Hereinafter, their detailed descriptions will be omitted to avoid redundancy.

Hereinafter, an example in which a plurality of fan module fastening parts are formed at a fan module will be described with reference to FIG. 8.

A plurality of fastening parts having different forming heights may be formed at the fan mounter 100 of the fan modules 81, 82, and 83, particularly, the variable fastening plate 102. The plurality of fastening parts may be formed at the variable fastening plate 102 to be spaced apart from one another in the top-bottom direction. A slider fastening part 77 formed at the slider 70 and fan module fastening parts having a larger number than the slider fastening part 77 may be formed at the variable fastening plate 102.

The slider 70 and the variable fastening plate 102 may be fastened by a fastening member disposed to pass through one of the plurality of fan module fastening parts and the slider fastening part 77.

For example, one slider fastening part 77 may be formed at the slider 70, and two or three or more fan module fastening parts may be formed in each of the fan modules 81, 82, and 83.

Hereinafter, an example in which three fan module fastening parts 103, 104, and 105 are formed in each of the fan modules 81, 82, and 83 will be described.

Three fan module fastening parts 103, 104, and 105 having different forming heights may be formed at the fan mounter 100 of the fan modules 81, 82, and 83, particularly, the variable fastening plate 102. The three fan module fastening parts 103, 104, and 105 may be spaced apart from one another in the top-bottom direction.

The variable fastening plate 102 may include a lower fan module fastening part 103 at which the fan module is fastened at the highest height to the slider 70, an upper fan module fastening part 105 formed higher than the lower fan module fastening part in the various fastening plate 102 such that the fan module is fastened at the lowest height to the slider 70, and a center fan module fastening part 104 formed between the lower fan module fastening part 103 and the upper fan module fastening part 105.

The lower fan module fastening part 103, the center fan module fastening part 104, and the upper fan module fastening part 105 may be spaced apart from one another in the top-bottom direction.

When the plurality of fans of the fan module are installed at the highest height, the variable fastening plate 102 may be fastened to the slider 70 using fastening members 106 and 107 such as a bolt and a nut in a state in which the lower fan motor fastening part 103 corresponds to the slider fastening part 77 in the front-rear direction.

When the plurality of fans of the fan module are installed at the lowest height, the variable fastening plate 102 may be fastened to the slider 70 using fastening members 106 and 107 such as a bolt and a nut in a state in which the upper fan motor fastening part 105 corresponds to the slider fastening part 77 in the front-rear direction.

When the plurality of fans of the fan module are installed at the middle height, the variable fastening plate 102 may be fastened to the slider 70 using fastening members 106 and 107 such as a bolt and a nut in a state in which the center fan motor fastening part 104 corresponds to the slider fastening part 77 in the front-rear direction.

Figure 9:
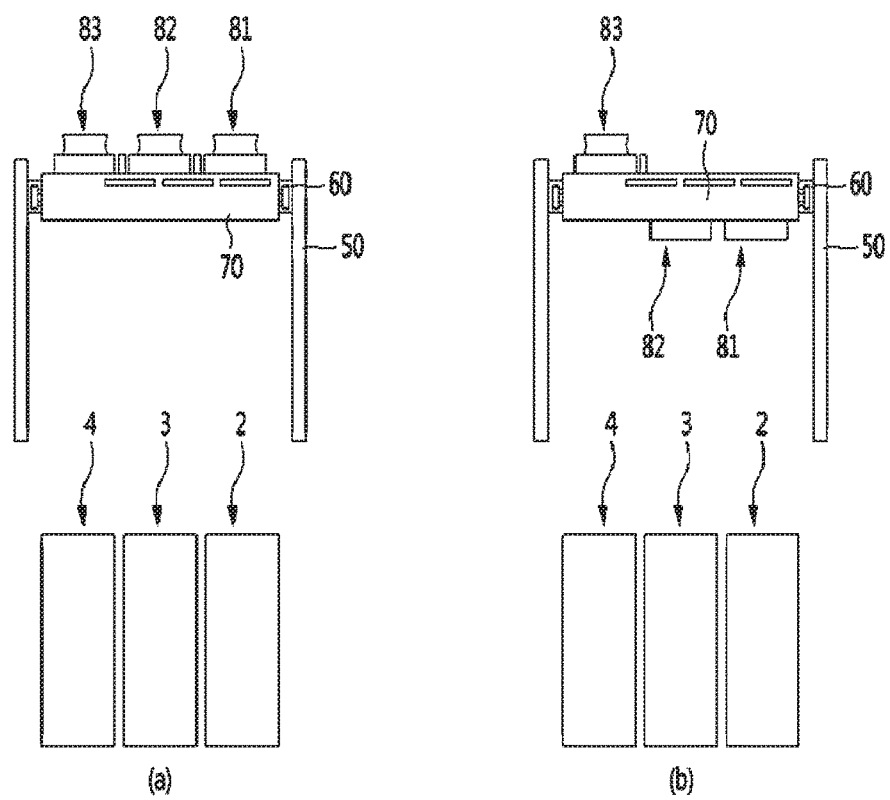
FIG. 9 is a front view showing an example in which the plurality of fan modules of the fan assembly are entirely installed at a high height according to the exemplary embodiment.
Figure 10:
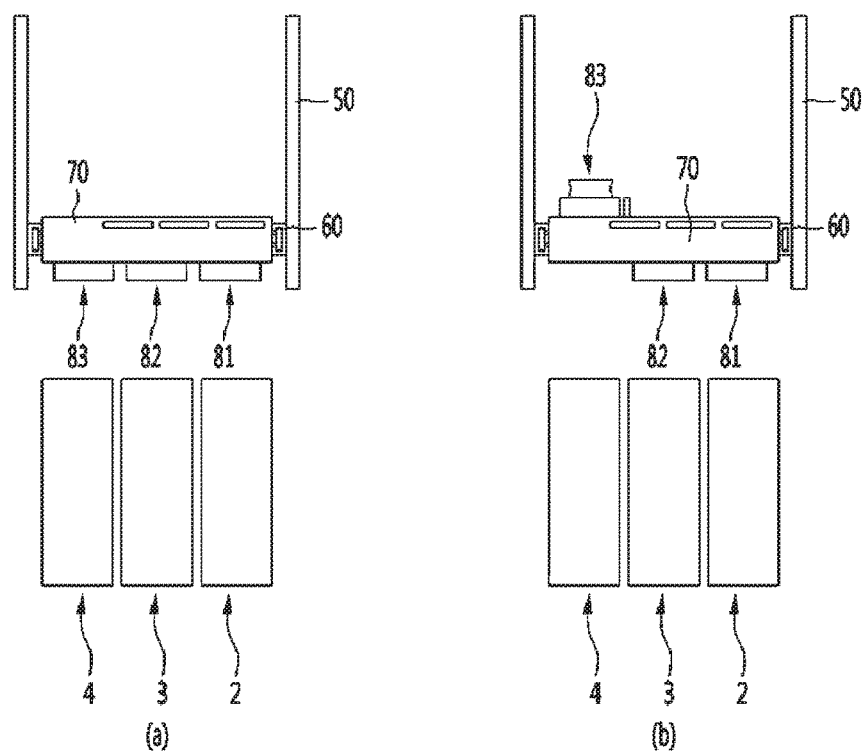
FIG. 10 is a front view showing an example in which the plurality of fan modules of the fan assembly are entirely installed at a low height according to the exemplary embodiment.

FIG. 9 is a front view showing an example in which the plurality of fan modules of the fan assembly are entirely installed at a high height according to the exemplary embodiment. FIG. 10 is a front view showing an example in which the plurality of fan modules of the fan assembly are entirely installed at a low height according to the exemplary embodiment.

(a) of FIG. 9 shows an example in which the second guide 60 is mounted to the first guide 50 such that the height of the slider 70 is high, and all of the plurality of fan modules 81, 82, and 83 are installed at a high height at the slider 70. In addition, (b) of FIG. 9 shows an example in which the fan modules 2 and 3 located over the modules 2 and 3 of which amount of heat dissipation is to be increased are installed lower than the case of (a) of FIG. 9.

The plurality of modules 2, 3, and 4 may have different temperatures according to their operations, and the temperatures of some 2 and 3 of the plurality of modules 2, 3, and 4 may be higher than a reference value. The worker, as shown in (b) of FIG. 9, may lower the installation height of the fan modules 81 and 82 located over the modules 2 and 3 of which temperatures are higher than the reference value.

In this case, the fan modules 81 and 82 of which installation height is lowered as shown in (b) of FIG. 9 can rapidly suck a large amount of air into the modules 2 and 3 located thereunder, as compared with the case of (a) of FIG. 9, and the heat dissipation performance of the modules 2 and 3 located under the fan modules 81 and 82 of which installation height is lowered can be improved. That is, the temperature of the modules 2 and 3, which is higher than the reference value, can be lowered to less than the reference value by the fan modules 81 and 82 of which installation height is lowered.

(a) of FIG. 10 shows an example in which the second guide 60 is mounted to the first guide 50 such that the height of the slider 70 is low, and all of the plurality of fan modules 81, 82, and 83 are installed at a low height. In addition, (b) of FIG. 10 shows an example in which the fan module 83 located over the module 4 of which heat dissipation performance is relatively high is installed higher than the case of (a) of FIG. 10.

The plurality of fan modules 81, 82, and 83 installed as show in (a) and (b) of FIG. 10 enable a large amount of air to more rapidly flow into the plurality of modules 2, 3, and 4, as compared with those installed as shown in (a) and (b) of FIG. 9.

In the fan assembly 5, the plurality of fan modules 81, 82, and 83 may be operated together in the state in which they are installed as shown in (a) of FIG. 10, and the temperatures of the plurality of modules 2, 3, and 4 may be different according to their operations. The temperatures of some 2 and 3 of the plurality of modules 2, 3, and 4 may be excessively higher than an upper limit temperature. The worker may increase the height of the fan module 83 located over the module 4 of which temperature is not relatively high, to increase the amount of air supplied to the modules 2 and 3 of which temperatures are excessively high and to decrease the amount of air supplied to the module 4 of which temperature is not relatively excessive.

In this case, the distance between the module 4 of which temperature is not relative high and the fan module 83 of which height is increased upward is increased. Thus, a larger amount of air sucked into the solar power conversion system can be sucked toward the other fan modules 81 and 82 of which height is not increased, and can be sucked into the modules 2 and 3 of which temperature is excessively high. Further, the heat dissipation performance of the modules 2 and 3 of which temperature is excessively high can be improved.

As described above, in this embodiment, as the installation height of the slider 70 and the installation height of each of the plurality of fan modules 81, 82, and 83 are varied, the current and amount of air flowing into the plurality of modules 2, 3, and 4 can be variously changed, and heat of each of the plurality of modules 2, 3, and 4 can be more efficiently dissipated based on the temperature of each of the plurality of modules 2, 3, and 4.

Meanwhile, when a service for the plurality of fan modules 81, 82, and 83 is performed, the worker may pull the slider 70 to the front as shown in FIG. 3. In this case, the positions of the plurality of fans 91, 92, and 93 installed in the slider 70 may be changed in the front direction over the plurality of modules 2, 3, and 4, and the plurality of fans 91, 92, and 93 may be extracted from the space S of the case 1. When the plurality of fans 91, 92, and 93 are extracted from the space S of the case 1, the plurality of modules 2, 3, and 4 are not located under the plurality of fans 91, 92, and 93. Thus, it is unnecessary that the worker should extract the plurality of modules 2, 3, and 4 to the outside of the case 1 so as to perform a service for the plurality of fans 91, 92, and 93. Further, the worker can conveniently perform a service of the plurality of fans 91, 92, and 93 in the state in which the slider 70 is extracted to the outside of the case 1.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A fan assembly comprising:
   a first guide;
   a second guide disposed in a direction vertical to the first guide such that the height of the second guide is adjustable;
   a slider disposed to move in a horizontal direction along the second guide; and
   a plurality of fan modules fastened to the slider,
   wherein each of the plurality of fan modules is fastened to the slider such that the height of each of the plurality of fan modules is adjustable,
   wherein the slider includes:

a front body to which each of the plurality of fan modules is fastened such that the height of each of the plurality of fan modules is adjustable;

a side body disposed at the rear of the front body; and a roller rotatably installed at the side body to roll along the second guide.

2. The fan assembly of claim 1, wherein each of the plurality of fan modules includes:

a plurality of fans; and a fan mounter mounted such that the plurality of fans blow air, wherein the fan mounter includes a variable fastening plate fastened to the slider such that the height of the variable fastening plate is adjustable.

3. The fan assembly of claim 2, wherein a slider fastening part is formed at the slider, wherein a plurality of fan module fastening parts spaced apart from one another in a top-bottom direction are formed at the variable fastening plate, wherein the slider and the variable fastening plate are fastened by a fastening member disposed to pass through one of the plurality of fan module fastening parts and the slider fastening part.

4. The fan assembly of claim 2, wherein the fan mounter further includes:

a plurality of air guides; and an air guide installation plate at which the plurality of air guides are installed, the air guide installation plate being connected to the variable fastening plate.

5. The fan assembly of claim 1, further comprising a side air guide disposed next to a fan module having a high height among the plurality of fan modules.

6. The fan assembly of claim 5, further comprising an upper air guide disposed at an upper side between fan modules having the same height among the plurality of fan modules.

7. The fan assembly of claim 6, wherein a top end of the side air guide is higher than a top end of the upper air guide.

8. The fan assembly of claim 6, wherein a side air guide fixing part to which the side air guide is fixed and an upper air guide fixing part to which the upper air guide is fixed are formed together at the slider.

9. The fan assembly of claim 1, further comprising a slider handle disposed at the front of the slider.

10. An electric power apparatus comprising:

a case having a space formed therein;

a plurality of modules arranged in the space; and a fan assembly disposed in the space to be located over the plurality of modules, the fan assembly allowing air to flow into the plurality of modules, wherein the fan assembly includes:

a first guide mounted in the case, the first guide being disposed in a vertical direction;

a second guide disposed in a direction vertical to the first guide, the second guide disposed in a horizontal direction;

a slider disposed to move in the horizontal direction along the second guide; and a plurality of fan modules fastened to the slider, wherein the plurality of fan modules correspond one by one to the plurality of modules, wherein each of the plurality of fan modules is fastened to the slider such that the height of each of the plurality of fan modules is adjustable, wherein each of the plurality of fan modules includes:

a plurality of fans blowing air in an upper direction; and a fan mounter to which the plurality of fans are mounted, wherein the fan mounter includes a variable fastening plate fastened to the slider such that the height of the variable fastening plate is adjustable, wherein the slider includes:

a front body to which the variable fastening plate is fastened such that the height of the variable fastening plate is adjustable;

a side body disposed at the rear of the front body; and a roller rotatably installed at the side body to roll along the second guide.

11. The electric power apparatus of claim 10, wherein the fan mounter further includes:

a plurality of air guides hollowed in a top-bottom direction; and an air guide installation plate at which the plurality of air guides are installed, the air guide installation plate being connected to the variable fastening plate.

12. The electric power apparatus of claim 11, wherein the variable fastening plate is vertically disposed, and the air guide installation plate is horizontally disposed.

13. The electric power apparatus of claim 10, further comprising a side air guide disposed next to a fan module having a high height among the plurality of fan modules.

14. The electric power apparatus of claim 13, further comprising an upper air guide disposed at an upper side between fan modules having the same height among the plurality of fan modules, the upper air guide having at least a portion spaced apart from the side air guide in a left-right direction.

15. The electric power apparatus of claim 14, wherein the side air guide and the upper air guide are arranged in parallel to each other, wherein an air guide surface of the side air guide and an air guide surface of the upper air guide face each other.

16. The electric power apparatus of claim 14, wherein a side air guide fixing part to which the side air guide is fixed and an upper air guide fixing part to which the upper air guide is fixed are formed together at the slider.

17. The electric power apparatus of claim 10, further comprising a slider handle disposed to protrude in the front direction at the front of the slider.

* * * * *